(12) United States Patent
Barringer et al.

(10) Patent No.: US 6,924,988 B2
(45) Date of Patent: Aug. 2, 2005

(54) DYNAMIC ZERO CLEARANCE EXHAUSTING EMC SEALING SYSTEM

(75) Inventors: Dennis R. Barringer, Wallkill, NY (US); Justin C. Rogers, Poughkeepsie, NY (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 10/614,670

(22) Filed: Jul. 7, 2003

(65) Prior Publication Data

US 2005/0007749 A1 Jan. 13, 2005

(51) Int. Cl.⁷ .................................................. H05K 9/00
(52) U.S. Cl. ........................ 361/818; 361/800; 361/816; 174/35 R; 174/35 GC
(58) Field of Search ................................ 361/692, 728, 361/730, 752, 753, 800, 796–799, 816, 818; 174/32, 50, 52.1, 35 R, 35 GC, 35 MS; 277/919, 920

(56) References Cited

U.S. PATENT DOCUMENTS

| | | | |
|---|---|---|---|
| 5,943,219 A | 8/1999 | Bellino et al. | .............. 361/816 |
| 6,201,711 B1 | 3/2001 | Cherniski et al. | ........... 361/800 |
| 6,274,807 B1 * | 8/2001 | Pommerenke et al. | . 174/35 GC |
| 6,349,041 B1 | 2/2002 | Hayward et al. | ........... 361/818 |
| 6,424,526 B1 | 7/2002 | Heard | ......................... 361/687 |
| 6,444,900 B1 * | 9/2002 | Casey | .................. 174/35 GC |
| 6,620,999 B2 * | 9/2003 | Pommerenke et al. | . 174/35 GC |
| 6,625,039 B2 * | 9/2003 | Barringer et al. | ........... 361/800 |
| 6,646,197 B1 * | 11/2003 | Cugalj et al. | .......... 174/35 MS |
| 6,660,932 B1 * | 12/2003 | Barringer et al. | ......... 174/35 R |
| 6,683,796 B2 * | 1/2004 | Radu et al. | .................. 361/818 |
| 6,774,301 B1 * | 8/2004 | Kordes et al. | ......... 174/35 GC |
| 6,794,571 B1 * | 9/2004 | Barringer et al. | ...... 174/35 GC |
| 6,816,383 B2 * | 11/2004 | Barringer et al. | ........... 361/759 |
| 6,825,411 B2 * | 11/2004 | Pommerenke et al. | . 174/35 GC |
| 2002/0061102 A1 | 5/2002 | Miyazaki et al. | ........... 379/330 |

OTHER PUBLICATIONS

J. R. Dewitt, P. J. Galinis and R. Samper; "Self–Contained, Self–Secured Grounding Spring Providing EMC Sheilding Between Plastic and/or Metal Covers and Enclosures;" IBM Technical Disclosure Bulletin; vol. 33, No. 6A, Nov. 1990; pp. 213–218.

"EDS spring for PCMCIA cards;"Research Disclosure, Mar. 2000; p. 572.

"Spring Finger Electro–Magnetic Interference Sheild;" IBM Technical Disclosure Bulletin, vol. 39, No. 11, Nov. 1996, pp. 85–86.

* cited by examiner

Primary Examiner—Kamand Cuneo
Assistant Examiner—Dameon E. Levi
(74) Attorney, Agent, or Firm—Floyd A. Gonzalez; Cantor Colburn LLP

(57) ABSTRACT

A docking apparatus for printed circuit boards including a cassette housing, having a housing base, a housing cover and a housing wall, wherein the housing base and the housing wall are disposed relative to each other so as to define a housing cavity for containing a printed circuit card and wherein the housing wall includes a cable opening disposed so as to be communicated with the housing cavity, a housing bezel, disposed relative to the cassette housing so as to be associated with the cable opening and translatable therein, the housing bezel is in electrical communication with the printed circuit card and translatable therewith when the printed circuit card is engaged and disengaged with a printed circuit board, and an EMC sealing device disposed between the housing bezel and the cassette housing, the EMC sealing device configured to provide a movable EMC seal proximate the cable opening while still allowing airflow therethrough while covering a portion of the cable opening created between the housing and the housing bezel upon translation of the bezel.

22 Claims, 9 Drawing Sheets

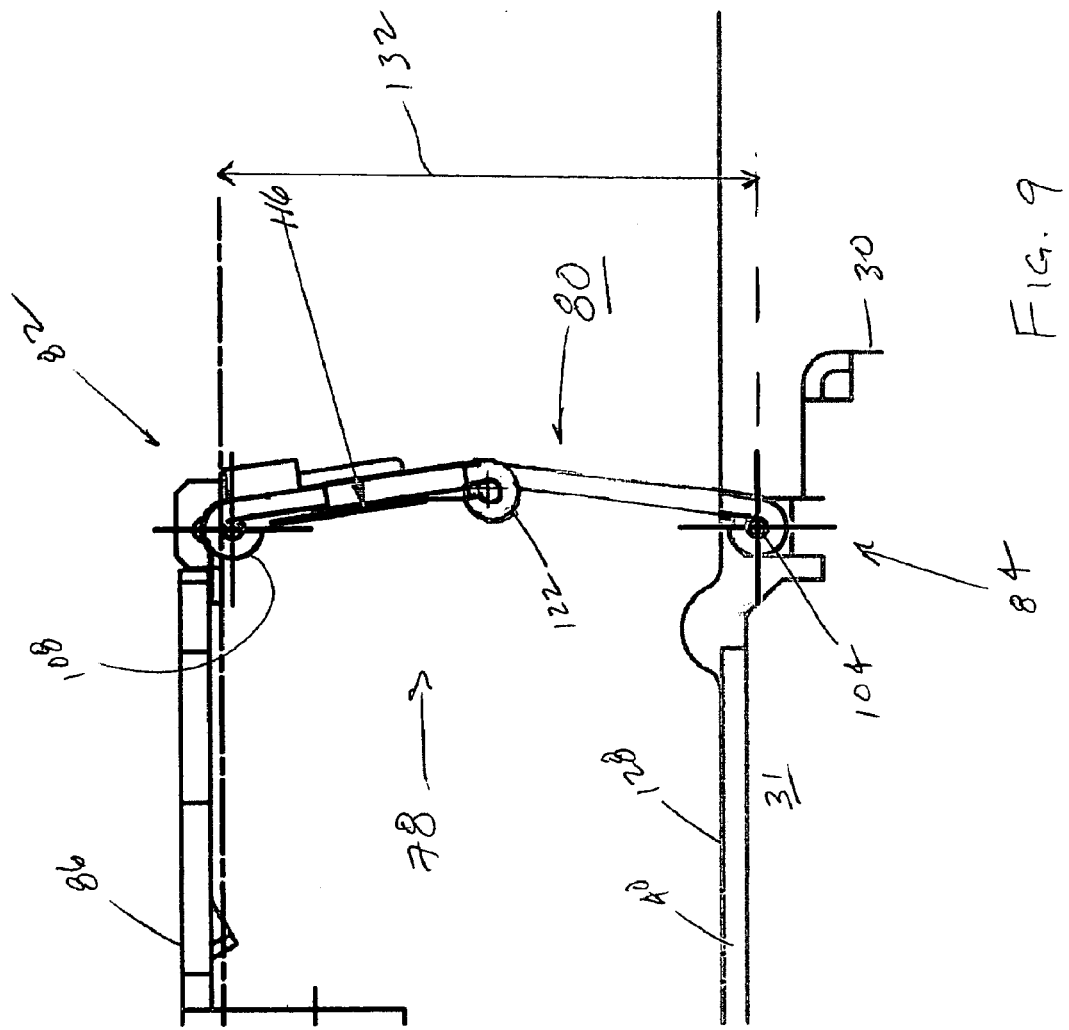

DYNAMIC ZERO CLEARANCE EXHAUSTING EMC SEALING SYSTEM

FIELD OF THE INVENTION

The present invention is generally directed to pluggable cartridges for inserting printed circuit cards into and for removing them from printed circuit boards. More particularly, the present invention is directed to a dynamic zero clearance exhausting EMC sealing system incorporated with the cartridge which provides a level of EMC shielding and thermal protection.

BACKGROUND OF THE INVENTION

The past twenty-five or so years have seen the development of ever smaller electrical circuit components at the chip level. However, to take fullest advantage of achievements in electrical circuit miniaturization, one must package the resultant printed circuit cards containing these chips in an efficient manner. Clearly, the packaging of printed circuit cards in tight spaces is a direct logical extension of increasing chip level circuit densities. It should also be noted that the tight packaging of integrated circuit chips on printed circuit cards and the correspondingly dense packaging of the printed circuit cards is a design goal that is carried out for more than just the convenience of compactness. Compactness provides shorter distances between circuit components which, in turn, serves the very desirable goal of being able to operate the circuits effectively at higher frequencies, thus increasing the speed of numerous different forms of electrical systems, including but not limited to data processing systems.

Moreover, mainly for reasons associated with long-term system operation and reliability, it is likewise very desirable to be able to easily insert and remove these printed circuit cards even when they are disposed in very tight spaces. The insertion and removal operations are also provided as an important part of a "hot-pluggability" function which is very desirable for "on the fly" repairs, replacements, maintenance and upgrades.

With increased circuit density there has also been an additional constraint on packaging design. It should be appreciated that increased circuit density is more susceptible to damage and performance disruptions due to thermal effects. As components and circuits become smaller, their packaging becomes smaller thus allowing manufacturers and designers to more densely populate boards and systems. However, the smaller packaging means that there is less opportunity to dissipate heat generated by the component. As a result, any externally radiated heat from PCB's or components surrounding the smaller packaging is less likely to be dissipated, thus producing thermal damage and/or noise within the circuit and component with increased circuit density, there is also a concomitant increase in power density and heat dissipation. Accordingly, packaging designs should be fully compatible with those aspects of system design associated with cooling functions. Also, to whatever extent possible, packaging designs should be: economical to produce; function smoothly; require little or no maintenance; be producible from inexpensive, readily available materials; and be reliably operable over a large number of insertion and removal operation cycles.

Yet one other concern arises in electrical systems as circuit feature size shrinks, operating frequencies increase and packaging densities grow larger, namely, the generation of electromagnetic interference (EMI). Electronic circuit packaging designs should thus also be compatible with structures and configurations that are employed to prevent the leakage of electromagnetic interference. To whatever extent possible, packaging designs should also include structures which actually contribute positively to the containment of electromagnetic interference. There is an ever increasing problem of electromagnetic interference caused by such devices. Virtually every electronic device, intentionally or not, emits some form of electromagnetic radiation. While this condition could be tolerated when few devices existed, the increasing number of electronic devices has made the problem more acute. The problem has been exacerbated by the "improvement" in semiconductor devices which allows them to operate at higher speeds, generally causing emission in the higher frequency bands where interference is more likely to occur. Successful minimization of the interference problem, sometimes referred to as "electromagnetic compatibility" or "EMC", generally requires that emissions from a given device be reduced by shielding and other means, and shielding be employed to reduce the sensitivity of a device to fields from other devices. Since shielding helps to reduce sensitivity to external fields as well as reduce emissions from the device, it is a common approach to a solution of the problem.

It is also noted that the present discussion refers to printed circuit boards and printed circuit cards. As contemplated herein, the printed circuit board is the larger component into which at least one printed circuit card is inserted for purposes of electrical connection. The present disclosure places no specific limits on either the size of a printed circuit board or the size of a printed circuit card. In the most general situation, a circuit board will be populated with a plurality of printed circuit cards. That is, the printed board will have a number of printed circuit cards inserted therein. Accordingly, as used herein, the terms "printed circuit board" and "printed circuit card" are considered to be relative terms.

Accordingly, the present inventors are presented with the following sometimes competing packaging problems: dense and close packaging, cooling, electromagnetic interference shielding, hot pluggability, the desire to provide an easy-to-load cartridge for carrying printed circuit cards, the removal of fully populated printed circuit boards and the insertion thereof, and means to provide a removable cooperative EMI shielding arrangement in a system which also provides circuit board thermal protection.

SUMMARY OF THE INVENTION

A docking apparatus for printed circuit boards including a cassette housing, having a housing base, a housing cover and a housing wall, wherein the housing base and the housing wall are disposed relative to each other so as to define a housing cavity for containing a printed circuit card and wherein the housing wall includes a cable opening disposed so as to be communicated with the housing cavity, a housing bezel, disposed relative to the cassette housing so as to be associated with the cable opening and translatable therein, the housing bezel is in electrical communication with the printed circuit card and translatable therewith when the printed circuit card is engaged and disengaged with a printed circuit board, and an EMC sealing device disposed between the housing bezel and the cassette housing, the EMC sealing device configured to provide a movable EMC seal proximate the cable opening while still allowing airflow therethrough while covering a portion of the cable opening created between the housing and the housing bezel upon translation of the bezel.

BRIEF DESCRIPTION OF THE DRAWINGS

Referring now to the figures, which are exemplary embodiments, and wherein like elements are numbered alike:

FIG. 9 is a partial side view of the EMC sealing system shown in FIG. 7.

DETAILED DESCRIPTION OF THE INVENTION

Figure 1:
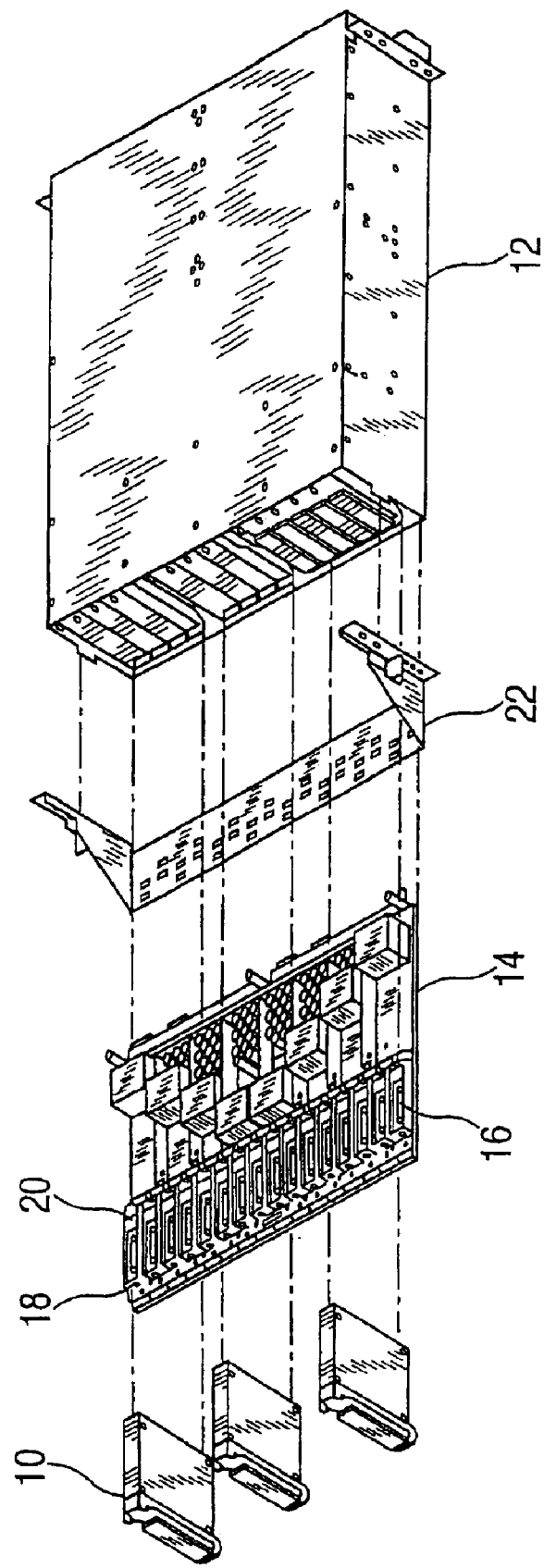
FIG. 1 is an exploded overall view of a docking cassette and a computer system in accordance with an embodiment of the intention.

Referring generally to FIG. 1, a docking apparatus or cassette 10 for mounting a printed circuit card (PCC) into a computer system 12 is shown, in accordance with an embodiment of the invention. Docking apparatus 10 preferably provides structural support to the PCC so as to allow for the easy insertion and removal of the PCC from computer system 12, as well as thermal and electrical isolation from other PCC's and components within the computer system.

Docking cassette 10 is disposed onto a computer system main board 14 or main printed circuit board (PCB) having a PCB connector receptacle 16, a first receptacle 18 and a second receptacle 20. Docking cassette 10 is preferably disposed onto computer system main board 14 such that a PCB connector is adjacent to PCB connector receptacle 16. In addition, main board 14 is slidably engaged with a cable tray 22 for releasably supporting and securing computer system 12 in a system rack (not shown).

Figure 2:
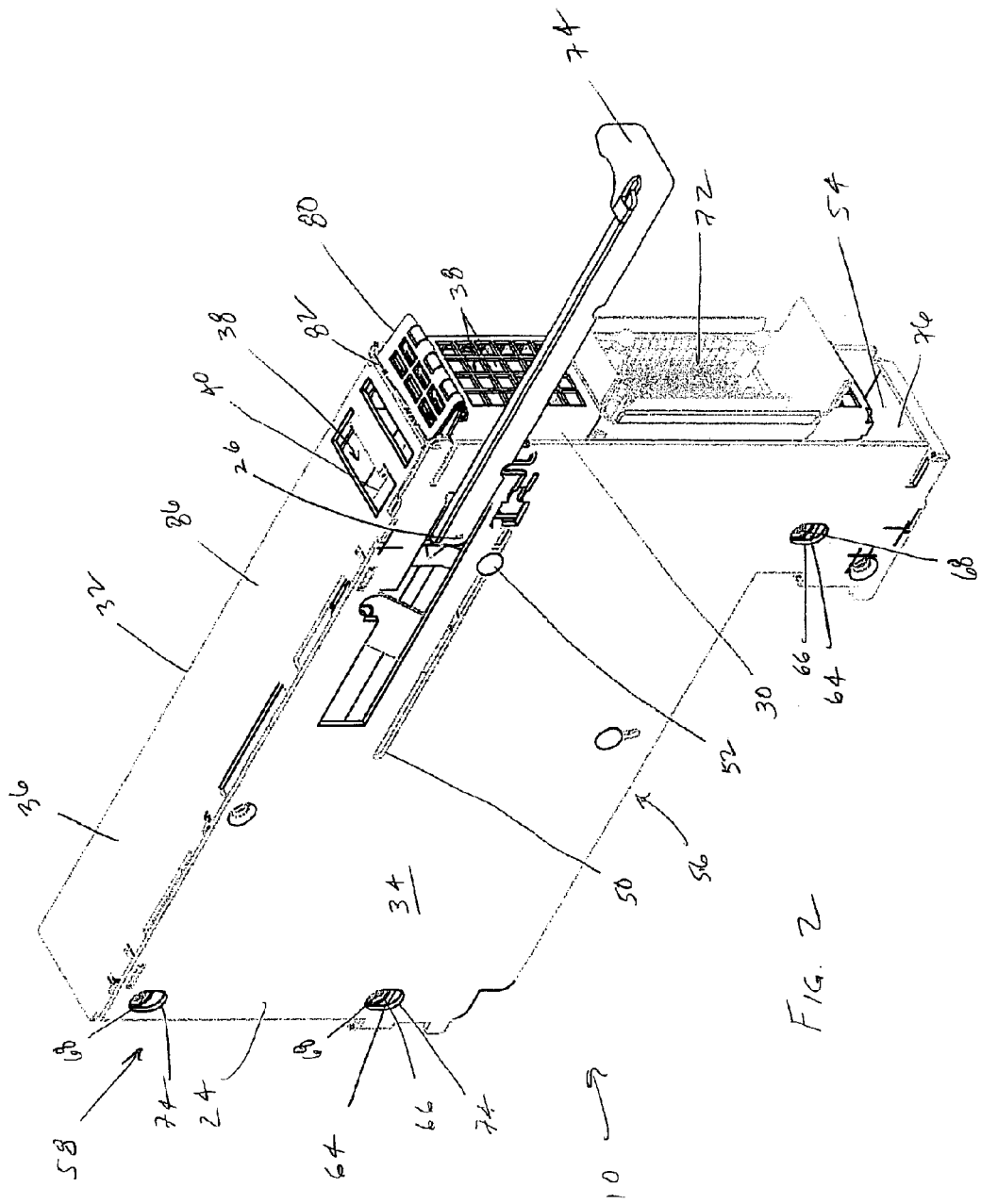
FIG. 2 is a perspective view of a docking cassette in accordance with an embodiment of the invention shown with a card in a retracted position.
Figure 3:
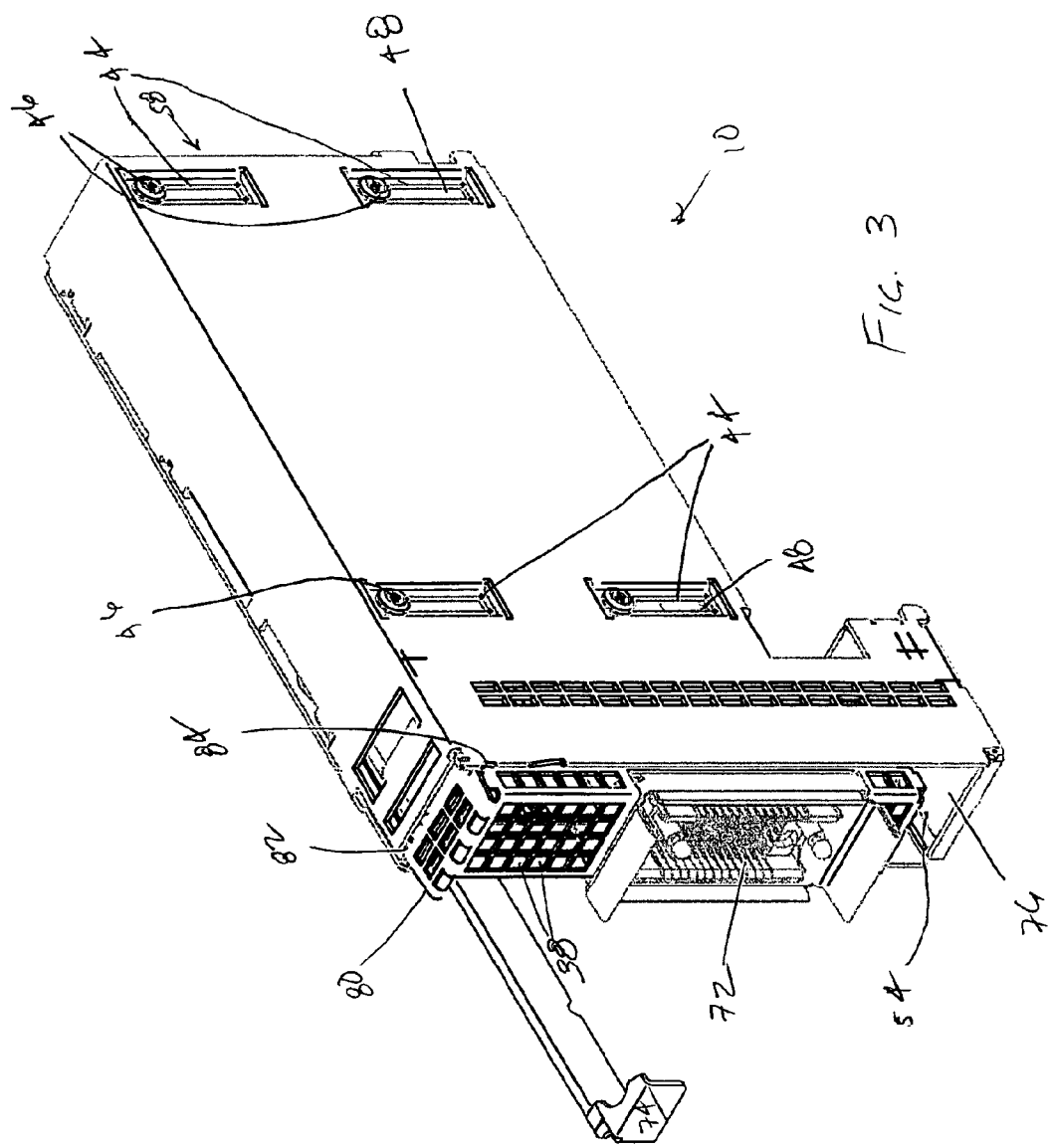
FIG. 3 is a perspective view of an opposite side of the docking cassette of FIG. 2.

Referring to FIGS. 2 and 3, docking apparatus 10 for mounting to a printed circuit board (PCB) in computer system 12 is shown, in accordance with an embodiment of the invention. Docking apparatus 10 preferably includes a cassette housing 24, a linkage mechanism 26 and a housing bezel 30. Cassette housing 24 preferably includes a housing base 32, a housing cover 34 and a housing wall 36, wherein housing base 32 and housing wall 36 are non-movably associated with each other and disposed relative to each other so as to define a housing cavity 38 for movably containing a PCC 40 therein. Preferably, housing base is referenced to ground.

In accordance with an exemplary embodiment with primary reference to FIG. 3, housing base 32 preferably includes four mounting devices 44 for movably holding PCC 40. PCC 40 preferably includes a PCC mounting mechanism 46 and mounting device 44 preferably includes a device opening 48 for slidingly containing PCC mounting mechanism 46, wherein PCC mounting mechanism 46 may be a screw, a pin or any mounting mechanism suitable to the desired end purpose. In addition, housing cover 34 preferably includes a linkage mounting receptacle 50 for associating linkage mechanism 26 with housing cover 34 (as best seen in FIG. 2). In accordance with an exemplary embodiment, although linkage mounting receptacle 50 is preferably a receptacle elongated opening for receiving a linkage mounting screw 52 to limit translation thereof, linkage mounting receptacle 50 maybe any receptacle device suitable to the desired end purpose, such as a clip receptacle. In accordance with an exemplary embodiment, it is considered within the scope of the disclosure that PCC 40 may be movably associated with housing cover 34 or housing base 32 using any device or method suitable to the desired end purpose, such as a screw or pin.

Housing wall 36 preferably includes a tail stock or bezel opening 54, a PCB connector opening generally shown at 56, and a plurality of vent openings generally disposed at 58. Moreover, housing wall 36 preferably includes at least one mounting structure 64 which defines a threaded cavity generally shown at 66 for receiving a mounting apparatus 68, such as a screw with reference to FIG. 2. In addition, PCB connector opening 56 and bezel opening 54 are preferably disposed so as to allow communication with the PCB connector 70 (FIG. 4) and the PCC cable connections 72 when PCC 40 is disposed within housing cavity 38.

Housing cover 34 preferably includes at least one cover opening 74 disposed so as to allow communication with mounting structure 64 when housing cover 34 is associated with housing wall 36. Cover opening 74 is preferably disposed so as to allow mounting apparatus 68 to communicate with threaded cavity 66 for removably securing housing cover 34 with housing wall 36. Although an exemplary embodiment describes housing cover 34 being removably secured with housing wall 36, it is considered within the scope of the disclosure that housing cover 34 may also be removably secured with housing base 32 and/or housing wall 36 using any mounting device or method suitable to the desired end purpose. Cassette housing is preferably 24 fabricated of an electrically conductive material, including, but not limited to, sheet metal, for example.

In accordance with an embodiment of the invention, tail-stock bezel 30 includes apertures 38 disposed in a length thereof for allowing air to pass therethrough and is preferably constructed from a rigid material having sufficient strength, such as steel and/or stainless steel. However, it is considered within the scope of the invention that tail-stock bezel 30 may be constructed from any material suitable to the desired end purpose.

Figure 4:
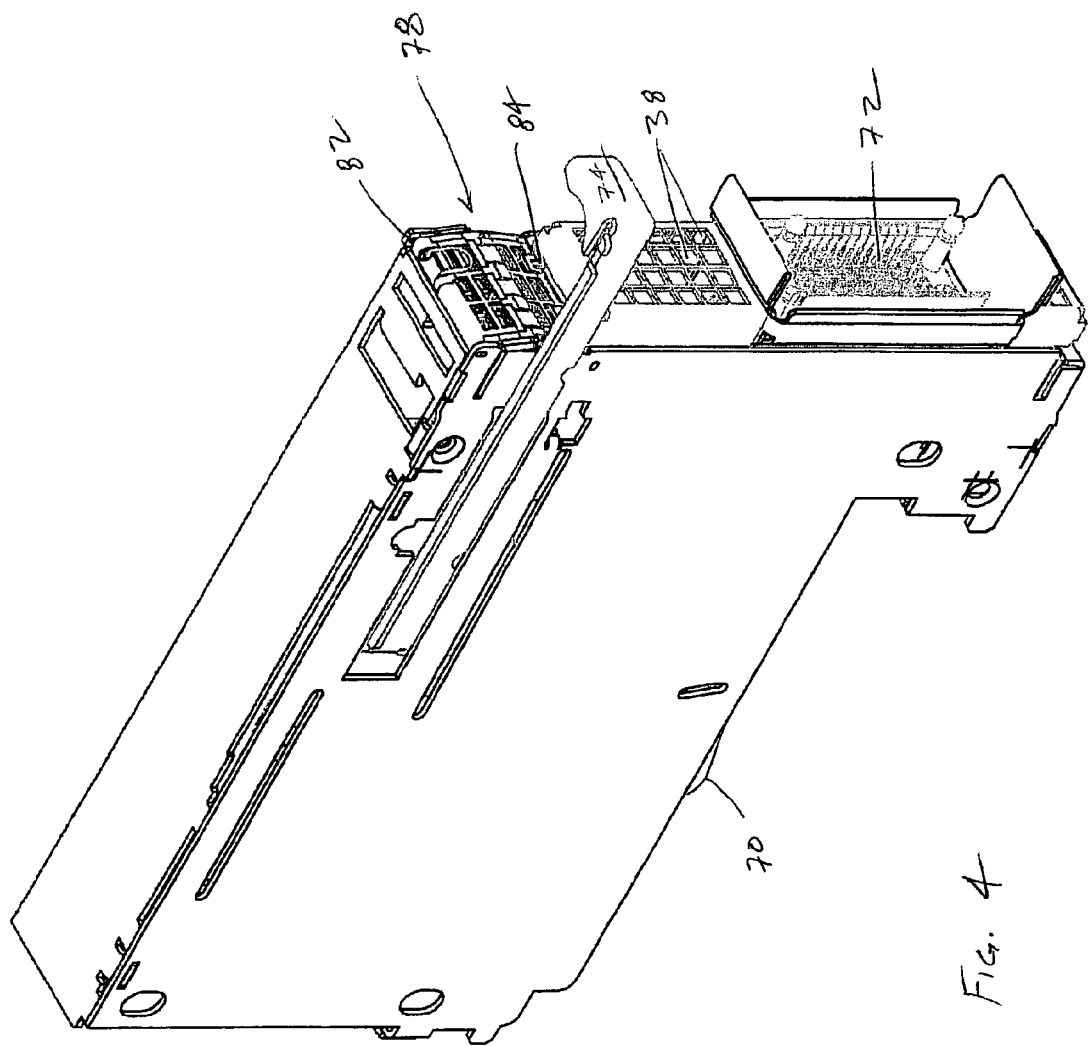
FIG. 4 is a perspective view of the docking cassette of FIG. 2 with the card in an extended position.
Figure 5:
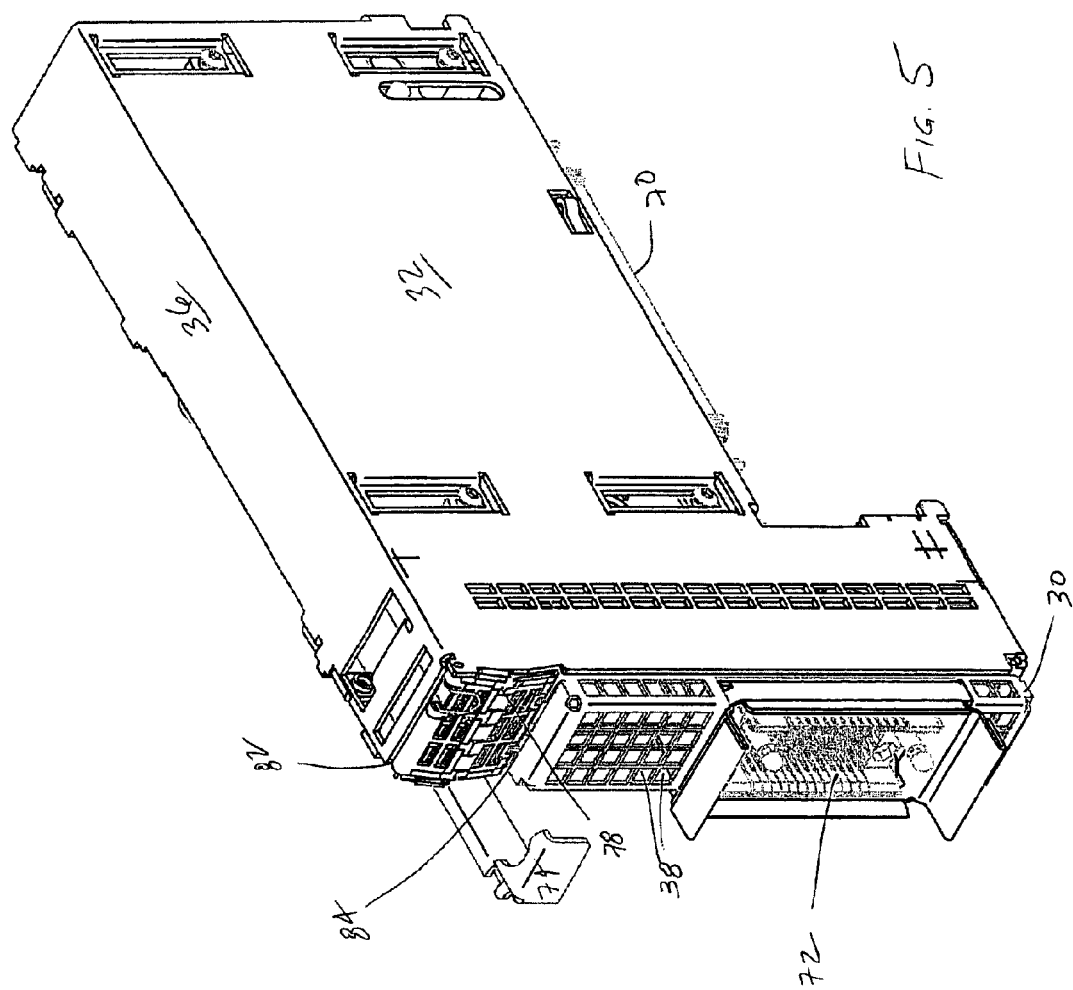
FIG. 5 is a perspective view of an opposite side of the docking cassette of FIG. 4.

Referring now to FIGS. 2–5, opening 54 and housing bezel 30 are correspondingly configured to allow translation of housing bezel 30 operably connected to PCC 40 within opening 54 to allow connection and disconnection of PCC connector 70 with a corresponding receptacle 16 when mechanism 26 is manually actuated via lever 74. In one embodiment, bezel 30 is configured with a flange 31 extending therefrom for mounting PCC 40 thereto (best seen in FIGS. 8 and 9). In accordance with an embodiment of the invention, housing bezel 30 and cassette housing 24 are preferably movably associated with each other so as to form a tail-stock opening 76 when card 40 and bezel 30 are in a first position or upward position as illustrated in FIGS. 2 and 3. Likewise, housing bezel 30 and cassette housing 24 are movably associated with each other so as to form a tail-stock opening generally show at 78 when card 40 and bezel 30 are in a second position or downward position as illustrated in FIGS. 4 and 5 consistent with card 40 being engaged with receptacle 16.

Translation of bezel 30 is limited by an EMC sealing device 80 hingedly attached at a first end 82 to housing 24 and at an opposite second end 84 to tail-stock bezel 30. EMC sealing device 80 is configured to allow an increase in the electronics density desired on PCC card 40 within housing 24 while acting as an EMC gasket which seals but also allowing for thermal exhaust for cooling purposes of the increased electronics density. EMC sealing device 80 is preferably configured to approach a zero thickness when card 40 is retracted toward a top side wall 86 of housing wall 36 but still seal about a 20 mm gap or opening 78 when card 40 is plugged into receptacle 16 and provide EMC sealing generally indicated at arrows 86 in FIG. 7 with housing 24. The 20 mm distance described above corresponds to card 40 travel between first and second positions corresponding to unplugged and plugged conditions, respectively, when lever 74 is manually actuated for purposes of engaging or disengaging PCC card 40 with a corresponding receptacle. It will be recognized that EMC sealing device 80 may be configured having any desired distance corresponding to card 40 travel and the vertical dimensions defining opening 78 created when card 40 is in the plugged position.

Figure 6:
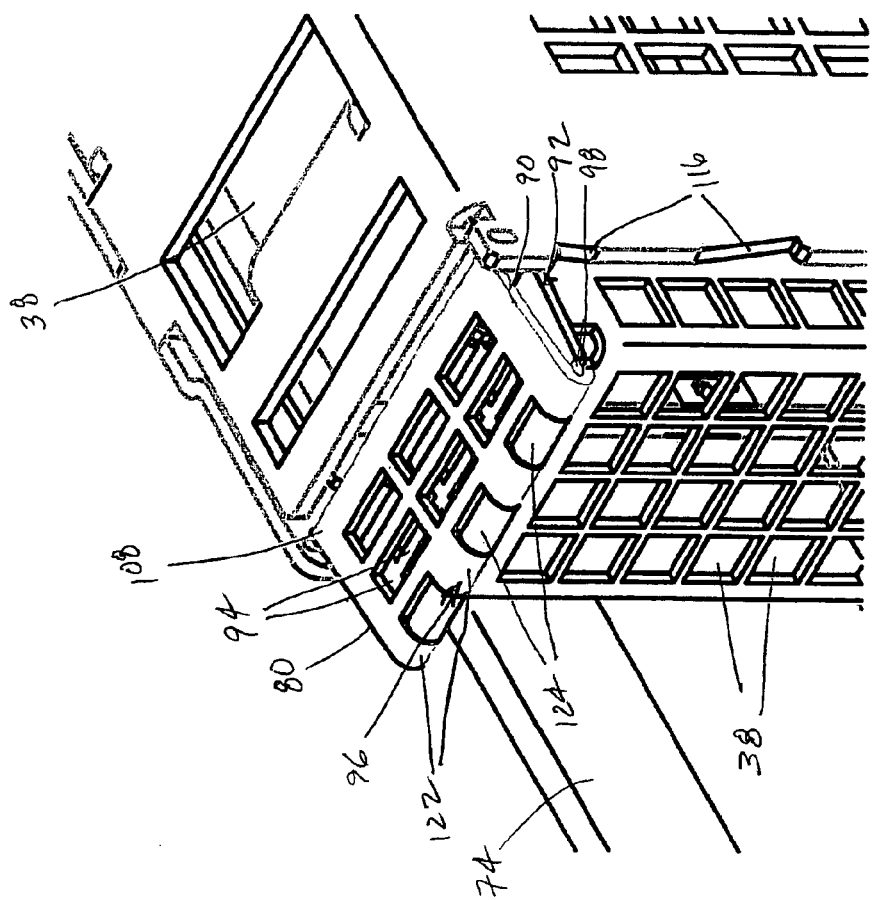
FIG. 6 is an enlarged perspective view of the docking cassette of FIG. 3 illustrating an exemplary embodiment of an EMC sealing system coupled with a translatable tail stock.
Figure 7:
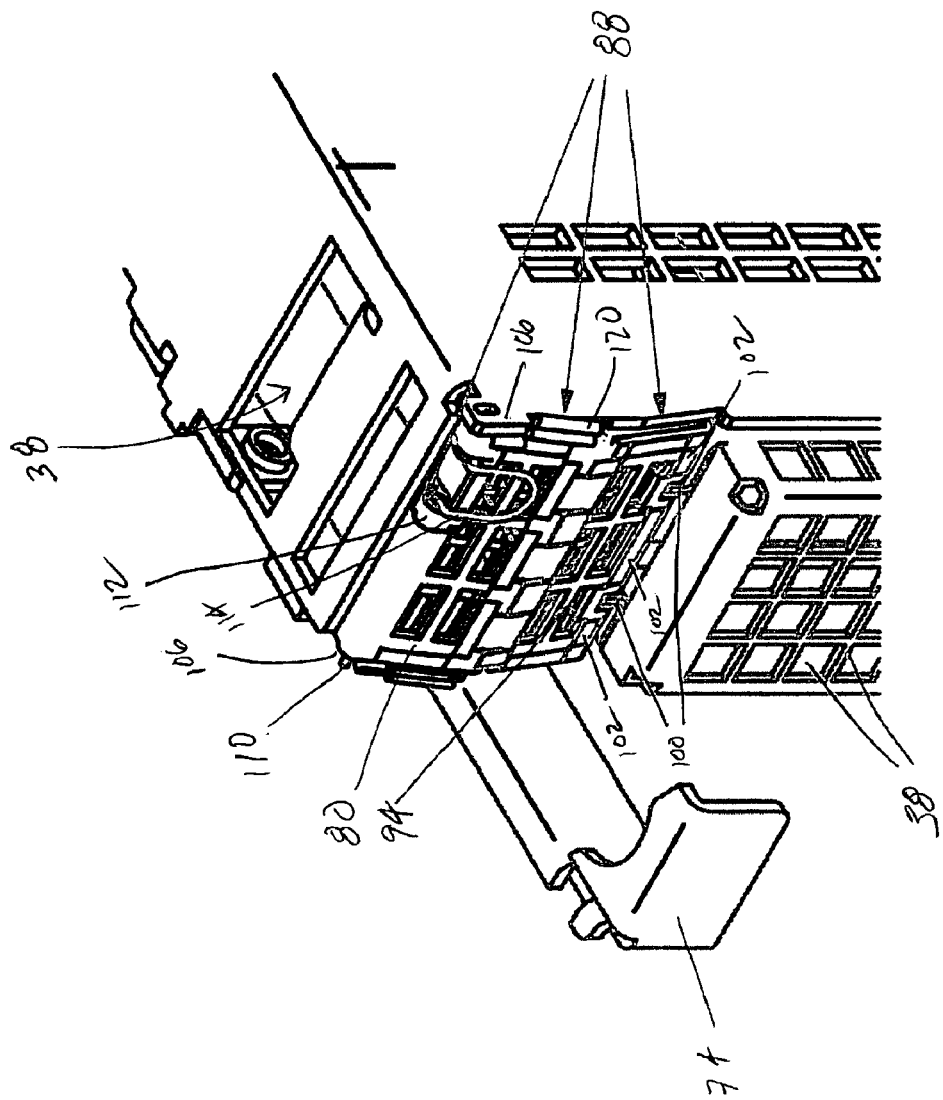
FIG. 7 is an enlarged perspective view of the docking cassette of FIG. 5 illustrating the EMC sealing system and tail stock in an extended position when the card attached thereto is protracted.

Referring now to FIGS. 6 and 7, EMC sealing device 80 is described in further detail. An exemplary embodiment of an EMC sealing device 80 is a two piece hinge that includes a first hinge plate 90 pivotally coupled with a second hinge plate 92 to form the two piece hinge. Each hinge plate 90 and 92 include apertures 94 configured therein to allow thermal exhaust from within cavity 38 of housing 24 (six apertures shown in each plate). First and second hinge plates 90, 92 are configured with a complementary link pattern generally indicated at 96 so that they may be abutted together and have a pin 98 extend through the complementary joined link pattern 96 to pivotally couple the plates 90, 92 and form the two piece hinge. It will be recognized however by one skilled in the pertinent art that may other configurations of plates 90 and 92 are contemplated to form a resulting two piece hinge having apertures 94 disposed therein. It will also be noted that the EMC sealing device is not limited to a two piece hinge configuration as three or more plates are contemplated depending on a translatable distance that bezel 30 must traverse, for example.

Second hinge plate 92 is pivotally coupled at second end 84 of EMC sealing device 80 with bezel 30 via two flanges 100 extending from bezel 30 to be complementary linked and abut three links 102 extending from second hinge plate 92. Flanges 100 and links 102 are configured to receive a second pin 104 (best seen in FIGS. 8 and 9) through apertures configured therein to pivotally couple bezel 30 to second hinge plate 92. However, it will be recognized that other suitable linking mechanisms may be employed to pivotally couple bezel 30 with second hinge plate 92 known in the art. It should also be recognized that in this manner, EMC sealing device 80 is configured for use in differently configured housing bezels 30.

First hinge plate 90 is pivotally coupled at first end 82 of EMC sealing device 80 with housing 24 via two flanges 106 extending on opposite sides of housing 24 defining a corner thereof. Each flange 106 includes an aperture and each flange 106 may extend from a respective housing base 32 and cover 34 or extend from outboard ends on wall 86 of housing wall 36. A rolled portion 108 (best seen in FIGS. 8 and 9) at end 82 opposite linked pattern 96 on first hinge plate 90 is rolled to form a through hole defined by a width of first plate 90 and adapted to receive a third pin 10 to be received in complementary apertures of flanges 106 to pivotally couple first hinge plate 90 with housing 24. In an exemplary embodiment depicted in FIG. 7, rolled portion 108 includes a cutout generally indicated at 112 to engage and disengage pin 110 therethrough by manually squeezing a U portion 114 extending therefrom.

First hinge plate 90 and second hinge plate 92 are configured to provide EMC sealing with housing 24 by making contact with edge portions 116 indicated in FIGS. 6 and 9 when device 80 is in a closed position or card 40 is protracted as illustrated in FIGS. 7 and 9 with EMC sealing indicated with arrows 88 in FIG. 7. In one embodiment as shown in FIG. 7, first hinge plate 90 may be configured having resilient wings 120 extending from outboard sides thereof to make contact with edges 116.

Figure 8:
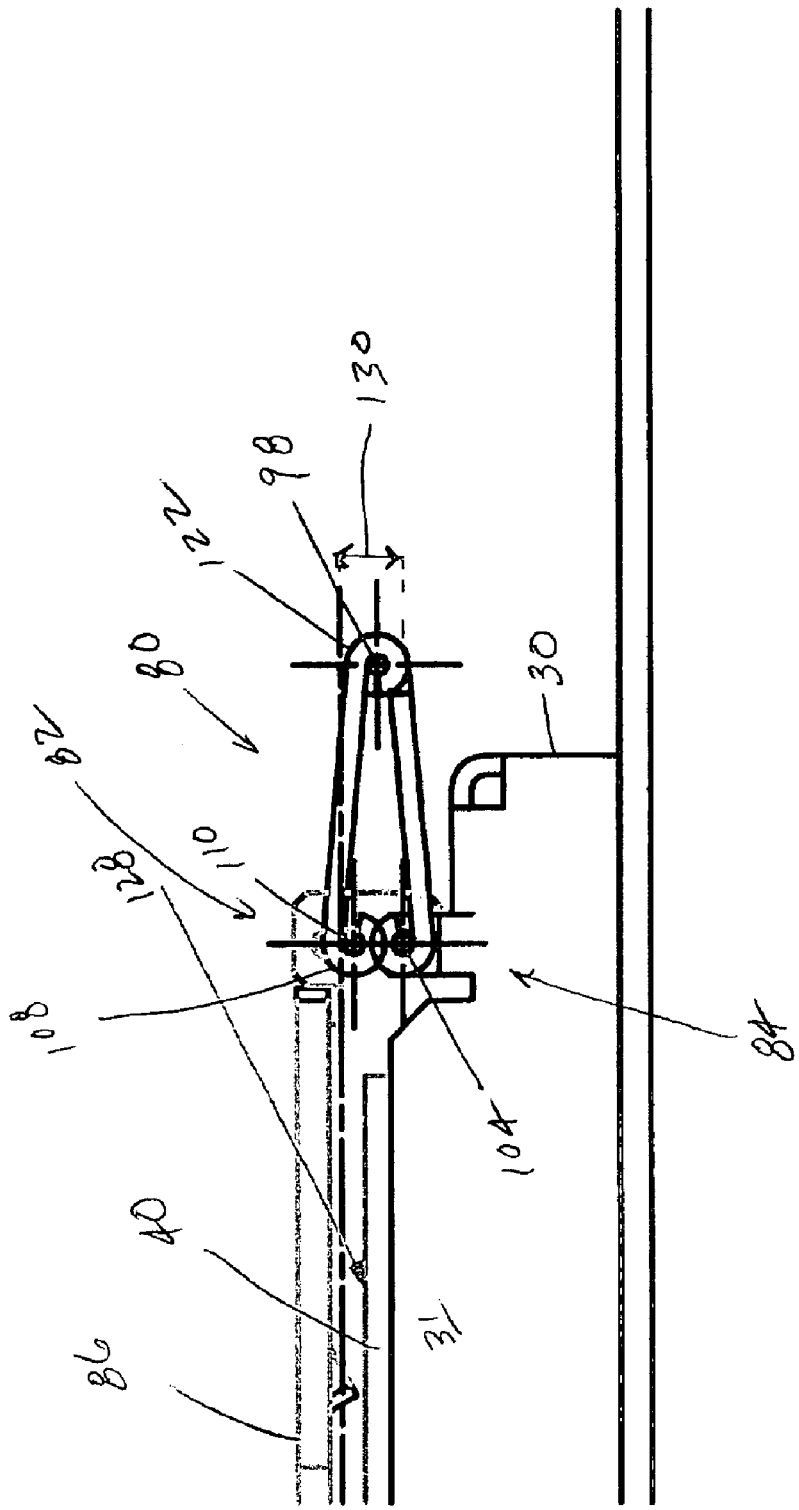
FIG. 8 is a partial side view of the EMC sealing system shown in FIG. 6.

Referring now to FIGS. 8 and 9, first hinge plate 90 is shown with rolled portion 108 at end 82 and an opposite end thereof corresponding with link pattern 96 having another intermittent rolled portion 122 linked with a corresponding rolled portion 124 of second hinge plate 92 forming link pattern 96 having pin 98 therethrough, as best seen with reference to FIGS. 6, 8 and 9. Second hinge plate 92 includes a rolled portion 126 opposite rolled portion 124 to receive pin 104 as discussed above.

FIG. 8 illustrates bezel 30 translated to a most upward position when a top edge 128 of PCC card 40 is nearly in contact with top side housing wall 86. In this position, card 40 is retracted and not engaged with PCB 12. In this retracted position, EMC sealing device 80 is folded upon itself such that a near zero distance indicated at 130 results in the folded position of device 80 allowing bezel 30 and card 40 to translate closer to top sidewall 86 of housing 24.

FIG. 9 illustrates bezel 30 translated to a most downward position when top edge 128 of PCC 40 has been translated toward PCB 12 to engage therewith. In this position, card 40 is protracted and electrically connected with PCB 12. In this protracted or extended position, EMC sealing device 80 is unfold folded such that a distance indicated at 132 results between first end 82 and second 84 in the unfolded position of device 80 allowing bezel 30 and card 40 to translate away from top sidewall 86 of housing 24. Distance 132 corresponds to opening 78 when bezel 30 is translated toward PCB 12 that is covered by EMC sealing device 80. In an exemplary embodiment shown in the figures, distance 132 corresponds to a distance of 20 mm, however, it is not intended to be limited thereto, as other distances larger and smaller are also contemplated to seal an opening 78 created by translation of bezel 30 toward PCB 12. Furthermore, when opening 78 is covered, apertures 94 in both plates 90, 92 of device allow thermal exhaust from within housing 24 by allowing air to flow therethrough while plates 90, 92 provide an EMC seal with housing 24 indicated by arrows 88 as best seen in FIG. 7.

In the above manner, EMC sealing device is configured to provide electrical continuity between PCC 40, bezel 30, and housing 24 and thus provide EMC shielding while allowing air to flow through apertures 94.

In accordance with an embodiment of the invention and referring to FIGS. 1–9, EMC sealing device 80 is preferably constructed from a rigid material having sufficient strength and electromagnetic compatibility properties, such as beryllium copper and/or stainless steel. However, it is considered within the scope of the invention that device 80 may be constructed from any material suitable to the desired end purpose. It will also be understood that although EMC sealing deice has been described having a two piece hinged structure disposed with housing 24 and bezel 30 to provide electrical continuity therebetween between, a different configuration and/or number of apertures 94 and plates 90, 92 are contemplated and do not necessarily have pin hinges as described above for one exemplary embodiment. The EMC sealing device described herein is a movable seal that allows for PCC insertion and extraction with the docking cassette that is universally adaptable for use with translatable housing bezels, while still making suitable ground contact and allowing proper air flow therethrough.

In accordance with an embodiment of the invention, bezel 30 is preferably constructed from a rigid material having sufficient strength, such as steel and/or stainless steel. However, it is considered within the scope of the invention that bezel 30 may be constructed from any material suitable to the desired end purpose.

In summary the above disclosure provides a functional gasket which provides maximum air flow while still completing the necessary EMC sealing requirements. This is accomplished by creating a physical connection on the card tailstock and the outer enclosure surface. This connection is hinged from a near zero thickness in the unplugged position to 20 mm tall seal in the plugged position in an exemplary embodiment thereof.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A docking apparatus for printed circuit boards comprising:
    a cassette housing, having a housing base, a housing cover and a housing wall, wherein said housing base and said housing wall are disposed relative to each other so as to define a housing cavity for containing a printed circuit card and wherein said housing wall includes a cable opening disposed so as to be communicated with said housing cavity;
    a housing bezel, disposed relative to said cassette housing so as to be associated with said cable opening and translatable therein, said housing bezel in electrical communication with said printed circuit card and translatable therewith; and
    an EMC sealing device disposed between said housing bezel and said cassette housing, said EMC sealing device configured to provide a movable EMC seal proximate said cable opening while still allowing airflow therethrough while covering a portion of said cable opening created between said housing and said housing bezel upon translation of said bezel.

2. The docking apparatus according to claim 1, wherein said EMC sealing device includes a plurality of openings to provide airflow to cool said printed circuit card.

3. The docking apparatus according to claim 1, wherein said EMC sealing device provides said EMC seal having electrical engagement with said cassette housing and said bezel that is in electrical contact with said printed circuit card, said printed circuit card is in electrical contact with said housing base, and said housing base is referenced to ground.

4. The docking apparatus according to claim 1, wherein said cassette housing, said bezel and said EMC sealing device are made from a metallic material.

5. The docking apparatus according to claim 1, wherein said EMC sealing device includes a first hinge plate and a second hinge plate pivotally coupled together to form a two piece hinge, said first hinge plate is pivotally coupled at a first end to said cassette housing while said second plate hinge is pivotally coupled at a second end opposite said first end to said bezel, said first and second hinge plates each configured with a plurality of openings to allow air flow therethrough while removably closing a gap formed between said housing wall and said bezel to form said EMC seal.

6. The docking apparatus according to claim 5, wherein said EMC sealing device is configured to be folded upon itself approaching a zero thickness in a folded condition while unfolding and extending to cover a gap created between said bezel and said housing wall when said card is extended to a plugged in condition.

7. The docking apparatus according to claim 6, wherein said gap corresponds to a distance traveled by said card.

8. The docking apparatus according to claim 6, wherein outboard ends defining said first and second hinge plates provide electrical contact with edges defining said housing base and cover to provide said EMC seal while still allowing airflow therethrough via said plurality of openings.

9. The docking apparatus according to claim 6, wherein said EMC sealing device is configured to form said EMC seal at said gap formed between said bezel and housing wall while still allowing airflow through said gap.

10. The docking apparatus according to claim 8, wherein said EMC sealing device further comprises:
    at least one compressible contact extending from said outboard ends aligned with said edges defining said cable opening to make electrical contact therewith to form said EMC seal while allowing airflow in and out of said housing cavity.

11. The docking apparatus according to claim 6, wherein said plurality of openings are in coaction with a plurality of vents formed on a portion of said housing wall opposite said cable opening.

12. The docking apparatus according to claim 1, wherein said bezel includes a flange configured to electrically connect with said printed circuit card that is connected to said housing base referenced to ground.

13. The docking apparatus according to claim 1, wherein said housing bezel and said cassette housing corresponding configured to be in slidable physical contact relative to each other.

14. A docking apparatus comprising:
    a printed circuit card;
    a cassette housing having a mounting device and defining a housing cavity for movably containing said printed circuit card, said mounting device is disposed within said housing cavity so as to slidingly contain said printed circuit card within said housing cavity; and
    housing bezel, disposed relative to said cassette housing in a cable opening thereof so as to be associated with said cable opening and translatable therein, said housing bezel in electrical communication with said printed circuit card and translatable therewith to engage said printed circuit card with a printed circuit board via said mounting device; and an EMC sealing device disposed between said housing bezel and said cassette housing, said EMC sealing device configured to provide a movable EMC seal proximate said cable opening while still allowing airflow therethrough while covering a portion of said cable opening created between said housing and said housing bezel upon translation of said bezel.

15. The docking apparatus according to claim 14, wherein said EMC sealing device is a metallic material configured to allow said card extraction and insertion while still making a suitable ground contact.

16. The docking apparatus according to claim 14, wherein said EMC sealing device is configured for use in differently configured housing bezels.

17. The docking apparatus according to claim 14, further comprising:

a plurality of vents formed on a side wall of said housing coacting with a plurality of openings configured in said EMC sealing device and in the top of said housing bezel to aid air flowing through said housing.

18. The docking apparatus according to claim 14, wherein said EMC sealing device includes a first hinge plate and a second hinge plate pivotally coupled together to form a two piece hinge, said first hinge plate is pivotally coupled at a first end to said cassette housing while said second plate hinge is pivotally coupled at a second end opposite said first end to said bezel, said first and second hinge plates each configured with a plurality of openings to allow air flow therethrough while movably closing a gap formed by translation of said bezel in said cable opening to form said EMC seal.

19. The docking apparatus according to claim 18, wherein said EMC sealing device is configured to be folded upon itself approaching a zero thickness in a folded condition while unfolding and extending to cover a gap created between said bezel and said housing wall when said card is extended to a plugged in condition.

20. The docking apparatus according to claim 18, wherein outboard ends defining said first and second hinge plates provide contact with edges defining said cable opening to provide said EMC seal while still allowing airflow therethrough via said plurality of openings.

21. An apparatus for providing a thermal protection and electromagnetic conduction seal in a docking apparatus having a printed circuit card disposed therein for connection to a system backplane, said apparatus comprising:

a conductive cassette housing, having a housing base, a housing cover and a housing wall, wherein said housing base and said housing wall are disposed relative to each other so as to define a housing cavity for containing a printed circuit card and wherein said housing wall includes a cable opening disposed so as to be communicated with said housing cavity and a connector opening for a connector exposed in said connector opening for mating and connection with the system backplane;

a housing bezel, wherein said housing bezel is disposed relative to said cassette housing so as to be slidably associated with said cable opening, wherein said housing bezel including a plurality of openings in the top of said housing bezel for the flow of cooling air;

an EMC sealing device providing an EMC seal between said cassette housing and said housing bezel, said EMC sealing device configured to provide thermal protection via openings therein and an electromagnetic conduction seal to said printed circuit card translatable with said housing bezel; and a plurality of vents formed on one side of said wall coacting with said plurality of openings in the top of said housing bezel and said openings of said EMC sealing device to aid air flowing through said housing and providing electromagnetic shielding for said circuit card positioned within.

22. The apparatus according to claim 21, wherein said plurality of vents are formed on a side distal from said plurality of vents formed in said housing bezel.

* * * * *